United States Patent [19]
Yamada et al.

[11] Patent Number: 6,163,481
[45] Date of Patent: Dec. 19, 2000

[54] FLASH MEMORY WORDLINE TRACKING ACROSS WHOLE CHIP

[75] Inventors: Shigekasu Yamada; Colin S. Bill, both of Cupertino; Michael A. VanBuskirk, Saratoga, all of Calif.

[73] Assignees: Advanced Micro Devices, Inc., Sunnyvale, Calif.; Fujitsu Limited, Japan

[21] Appl. No.: 09/431,296

[22] Filed: Oct. 29, 1999

[51] Int. Cl.[7] .................................................. G11C 16/04
[52] U.S. Cl. ............................... 365/185.11; 365/185.05; 365/194
[58] Field of Search ........................ 365/185.11, 185.05, 365/194, 189.09

[56] References Cited

U.S. PATENT DOCUMENTS 5,936,895  8/1999  Shirley ................................ 365/189.07

*Primary Examiner*—A. Zarabian
*Attorney, Agent, or Firm*—Davis Chin

[57] ABSTRACT

A wordline tracking structure for use in an array of Flash EEPROM memory cells is provided. The tracking structure serves to match reference and sector core wordline voltages across the entire chip regardless of sector location. The tracking structure includes a second VPXG conductor line operatively connected between sector wordlines of a "far" sector and a reference cell mini-array. The second VPXG conductor line has a substantially smaller time constant than in a first VPXG conductor line operatively connected between an output of a boosting circuit and the sector wordlines of the "far" sector. As a consequence, the reference wordline voltage associated with the reference cell mini-array will track closely the sector wordline voltage during the read operation regardless of the location of the selected sector.

4 Claims, 5 Drawing Sheets

Near Sector
Prior Art

Far Sector
Prior Art

Near Sector

Far Sector

Far Sector

FLASH MEMORY WORDLINE TRACKING ACROSS WHOLE CHIP

BACKGROUND OF THE INVENTION

This invention relates generally to floating gate memory devices such as an array of Flash electrically, erasable programmable read-only memory (EEPROM) cells. More particularly, it relates to a semiconductor integrated circuit memory device which includes wordline tracking structure for matching reference and sector core wordline voltages across the entire chip regardless of sector location.

As is generally known in the art, there exists a class of non-volatile memory devices referred to as "Flash EEPROMs" which has recently emerged as an important memory device by combining the advantages of EPROM density with EEPROM electrical erasability. Such Flash EEPROMs provide electrical erasing and a small cell size. In a conventional Flash EEPROM memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

One type of architecture used for Flash memories is typically referred to as a NOR Flash memory architecture which is an array of Flash EEPROM cells (floating gate devices) which are divided into a plurality of sectors. Further, the memory cells within each sector are arranged in rows of wordlines and columns of bit lines intersecting the rows of wordlines. The source region of each cell transistor within each sector is tied to a common node. Therefore, all of the cells within a particular sector can be erased simultaneously and erasure may be performed on a sector-by-sector basis. The control gates of the cell transistors are coupled to wordlines, and the drains thereof are coupled to bit lines.

In order to program the Flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +9 volts applied thereto. These voltages produce "hot electrons" which are accelerated across the thin dielectric layer and onto the floating gate. This hot electron injection results in an increase of the floating gate threshold by approximately two to four volts.

For erasing the Flash EEPROM cell in conventional operation, a positive potential (e.g., +5 volts) is applied to the source region. The control gate is applied with a negative potential (e.g., −8 volts), and the drain region is allowed to float. A strong electric field develops between the floating gate and the source region, and a negative charge is extracted from the floating gate to the source region by way of Fowler-Nordheim tunneling.

In order to determine whether the Flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level approximately 50 to 100 $\mu$A. The programmed cell (storing a logic "0") will have considerably less current flowing.

For example, a 16 Mb (megabit) Flash memory core array is typically manufactured in the form of an N×M matrix on a single chip where N equals the number of rows and M equals the number of columns. Further, the memory core array may be divided into a left-half sector array and a right-half sector array. Each of the left-half and right-half sector arrays is formed of a number of sectors, such as sixteen, each defining a selectable block. Each sector is formed of a predetermined number of rows which are grouped together. For the 16 Mb array divided into sixteen sectors in the left-half sector array and sixteen sectors in the right-half sector array, each sector or block has a size of 512 rows and 1024 columns.

Such a typical 16 Mb memory core array 10 formed on a single chip 11 is illustrated in FIG. 1 which consists of a left-half sector array 12 and a right-half sector array 14. The left-half sector array 12 is composed of sixteen sectors, S0 through S15. Similarly, the right-half sector array 14 is composed of sixteen sectors, S16 through S31. Each of the sectors S0–S31 stores 512 K bits of data arranged in 512 rows and 1024 columns. As can be seen, the many sectors (S0–S31) are located individually across the entire chip 11. Thus, the distance between one corner sector (e.g., sector S24) and another corner sector (e.g., sector S23) is very long. As a result, the difference in locations between the various sectors in the memory core array 10 will create sensing problems during a Read mode of operation.

In particular, there is often required voltages to be internally generated that are greater than an external or off-chip power supply potential VCC which is supplied to it. For example, it is known that in Flash EEPROMs operating at VCC equal to +3.0 volts a high voltage of approximately +5.0 volts is needed to be produced for the reading mode of operation of the memory cells. As a consequence, the semiconductor memories also generally include an internal voltage boosting circuit for generating an output signal boosted to be higher than the external supply voltage. Such a voltage boosting circuit 16 is shown in FIG. 1 for generating a wordline supply voltage VPXG at node N1, which is passed to appropriate wordlines in the various sectors S0–S31 in the memory core array 10 via a row decoder 18.

The row decoder 18 is located centrally between the left-half sector array 12 and the right-half sector array 14. The row decoder is responsive to address signals for causing word drivers (not shown) to supply the wordline supply voltage VPXG from the boosting circuit 16 to the appropriate wordlines associated with the various sectors. The wordline supply voltage VPXG is typically in the range of +3.7 volts to +4.7 volts, which is raised above the input power supply potential VCC of typically +3.0 volts.

If it is assumed that the voltage boosting circuit 16 is positioned in a lower left-side portion of the chip 11, the sector S23 is located near to the boosting circuit 16 and the sector S24 is located very far from the boosting circuit. Thus, the wordline voltage VPXG1 on the wordline $WL_N$ at node N2 associated with the sector S23 will be substantially equal to the boosted voltage VPXG from the boosting circuit 16. This boosted voltage VPXG is a target voltage which is desired to be maintained across the entire chip. However, the wordline voltage VPXG2 on the wordline $WL_F$ at node N3 associated with the sector S24 will be substantially less than the target voltage for most of a sensing period during the Read mode of operation.

Further, it is assumed that a reference sector or mini-array 20 is generally positioned to be near to the boosting circuit 16. Thus, the reference wordline voltage on the wordline $WL_R$ at node N4 associated with the reference sector 20 will also be substantially equal to the boosted voltage VPXG. The reference sector or array 20 includes a plurality of reference cells arranged in rows and columns (e.g., 20×20). The resistor R1 represents a lumped resistive load associated with the conductor lead line 21 extending between the node N2 adjacent the "near" sector S23 and the node N3 adjacent the "far" sector S24. The capacitor $C_S$ represents the capacitive loading of a selected sector when it is connected to its associated wordline. The capacitor $C_S$ for the selected sector has the same value notwithstanding its location in the memory core array 10. The capacitor $C_R$ represents the capacitive loading at the input of the reference sector or array 20 and has a value which is much smaller than the capacitor $C_S$.

For a high speed read operation, it is necessary to read the sector core cell during the settling time of the wordline voltages, before they have reached a D.C. steady state. Thus, optimal reading is successfully obtained when the voltages on the wordline $WL_R$ and $WL_F$ voltages closely follow each other. Therefore, when it is desired to compare the voltage VPXG on the reference wordline $WL_R$ at the reference or sector array 20 to the voltage VPXG2 on the wordline associated with the "far" sector S24, there will be obtained a large difference between them. This is due to the fact that there is a mismatch in the resistance and capacitance residing in the paths traveling from the boosting circuit 16 to the reference wordline $WL_R$ in the reference sector 20 and to the memory core wordline $WL_F$ in the "far" sector S24. As a consequence, there would be caused a poor sense margin in sensing circuitry (not shown) used during the Reading, particularly for sensing conducting memory core cells.

In view of this, there has arisen a need to provide a wordline tracking structure for matching the reference and sector core wordline voltages across the entire chip regardless of sector location. This is accomplished in the present invention by the provision of a second VPXG conductor line operatively connected between sector wordlines of a "far" sector and a reference cell mini-array. The second VPXG conductor line has a substantially smaller time constant than in a first VPXG conductor line operatively connected between an output of a booster circuit and the sector wordlines of the "far" sector.

SUMMARY OF THE INVENTION

Accordingly, it is a general object of the present invention to provide a wordline tracking structure for use in Flash EEPROM memory cells arranged into a plurality of sectors which is relatively simple in its construction, is easy to manufacture, and has improved accuracy during reading over the prior art memory devices.

It is an object of the present invention to provide a wordline tracking structure for use in Flash EEPROM memory cells arranged into a plurality of sectors so as to avoid errors during reading.

It is another object of the present invention to provide a wordline tracking structure for use in Flash EEPROM memory cells divided into a plurality of sectors so as to match reference and sector core wordline voltages across the entire chip regardless of sector location.

It is still another object of the present invention to provide a wordline tracking structure for use in Flash EEPROM memory cells divided into a plurality of sectors which includes a second VPXG conductor line which is operatively connected between sector wordlines of a "far" sector and a reference cell mini-array.

In accordance with a preferred embodiment of the present invention, there is provided a wordline tracking structure for use in a semiconductor memory device having an array of flash EEPROM memory cells divided into a plurality of sectors. The wordline tracking structure serves to match reference and sector core wordline voltages across the entire chip regardless of sector location. The wordline tracking structure includes a second VPXG conductor line which is operative connected between sector wordlines of a "far" sector and a reference cell mini-array. The second VPXG conductor line has a substantially smaller time constant than in a first VPXG conductor line operatively connected between the output of a booster circuit and the sector wordlines of the "far" sector.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

A wordline tracking structure for use in Flash EEPROM memory cells is described. In the following description, numerous specific details are set forth, such as specific circuit configurations, components, and the like in order to provide a thorough understanding of the present invention. However, it should be apparent to those skilled in the art that the present invention may be practiced without these specific details. In other instances, well-known processes, circuits, and control lines, not particularly relevant to the understanding of the operating principles of the present invention, have been purposely omitted for the sake of clarity.

Figure 4:
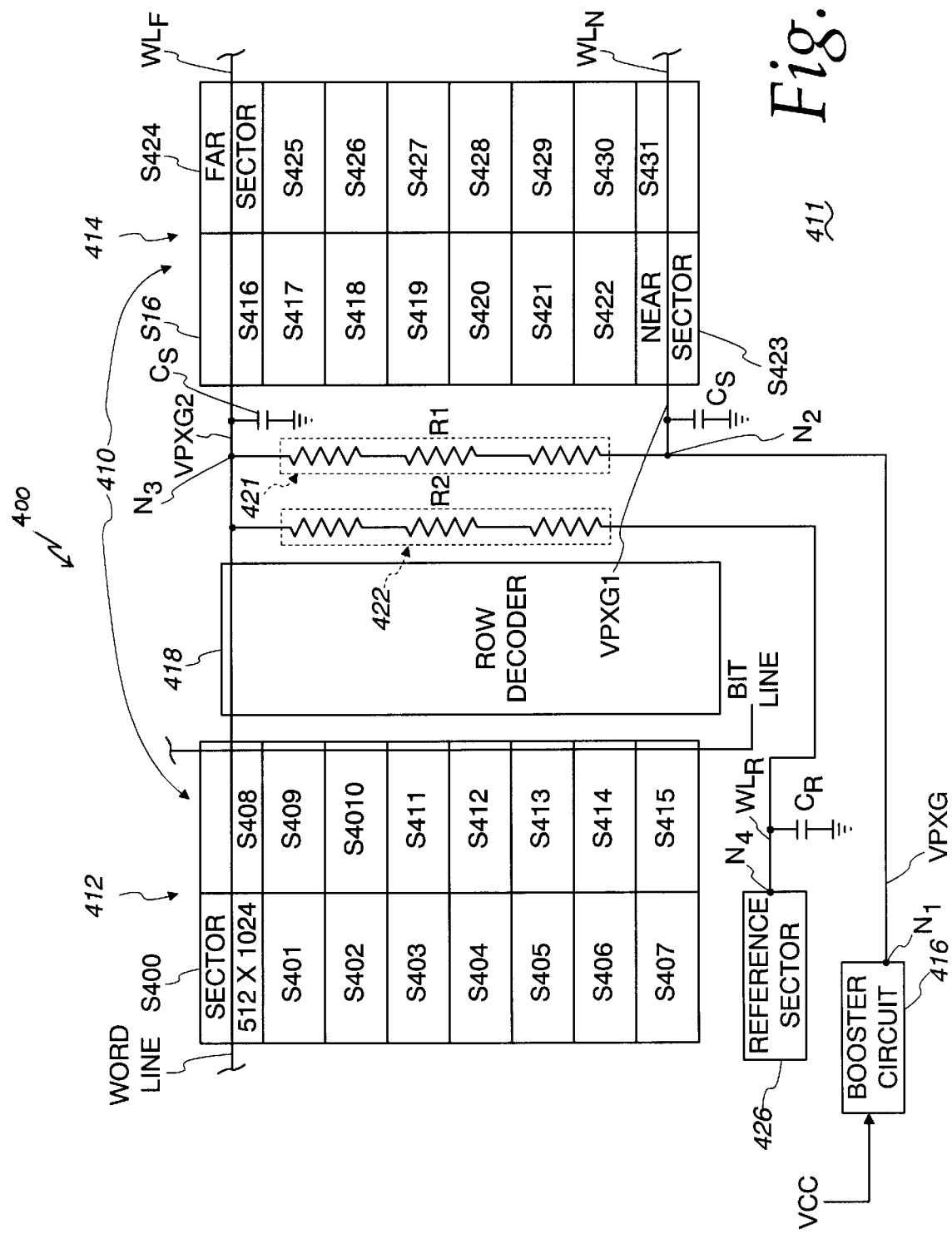
FIG. 4 is a simplified block diagram of a 16 Mb EEPROM semiconductor integrated circuit memory device having wordline tracking structure, constructed in accordance with the principles of the present invention.

Referring now in detail to the drawings, there is shown in FIG. 4 a simplified block diagram of an EEPROM semiconductor integrated circuit memory device 400 formed on a single chip 411 which includes a 16 Mb memory core array 410. The memory core array 410 consists of a left-half sector 412 and a right-half sector 414. The left-sector array 412 is composed of sixteen sectors, S400 through S415. Similarly, the right-half sector array 414 is composed of sixteen sectors, S416 through S431. Each of the sectors S400–S431 stores 512 K bits of data arranged in 512 rows and 1024 columns. It will be noted that the plurality of sectors S40–S431 are located individually across the entire chip 411. Thus, the distance between one corner sector (e.g., sector S424) and another corner sector (e.g., sector S423) is very long. Further, a voltage boosting circuit 416 is provided in a lower left-side portion of the chip 411 and is used to generate a wordline supply voltage VPXG. This wordline supply voltage VPXG is passed through appropriate wordlines in the various sectors in the memory core array 410 via a row decoder 18 and wordline drivers (not shown). The wordline supply voltage VPXG from the boosting circuit 416 is raised above the input power supply potential VCC. A reference cell mini-array or reference sector 420 is positioned to be near the boosting circuit 16. The reference sector 420 includes a plurality of reference cells arranged in rows and columns (e.g., 20×20). Further, there is provided a tracking structure of the present invention for tracking the wordline voltage of the reference cell sector with the wordline voltage of a memory core cell notwithstanding the location of the sector containing the memory core cell.

Figure 1:
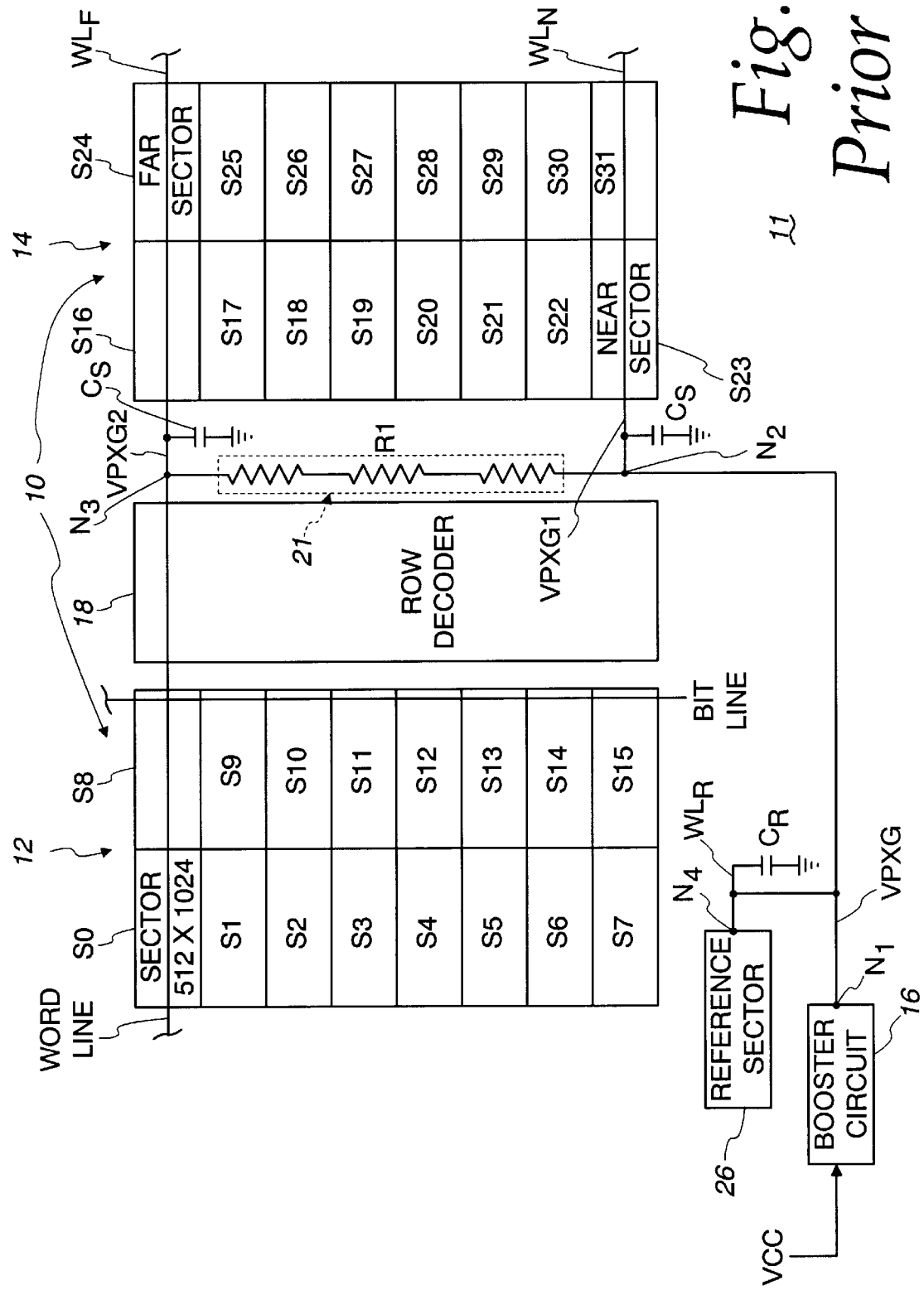
FIG. 1 is a simplified block diagram of a conventional 16 Mb EEPROM semiconductor integrated circuit memory device having an array of memory cells divided into a plurality of sectors.
Figure 2:
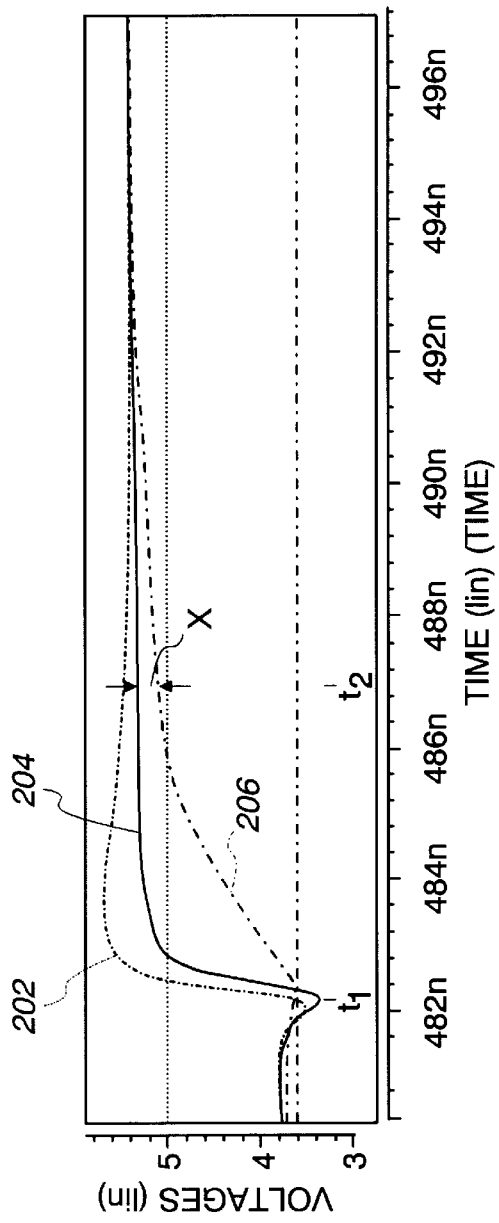
FIGS. 2 and 3 show the waveforms of various signals in the respective "near" and "far" sectors of FIG. 1, useful in understanding the problem encountered during reading.
Figure 3:
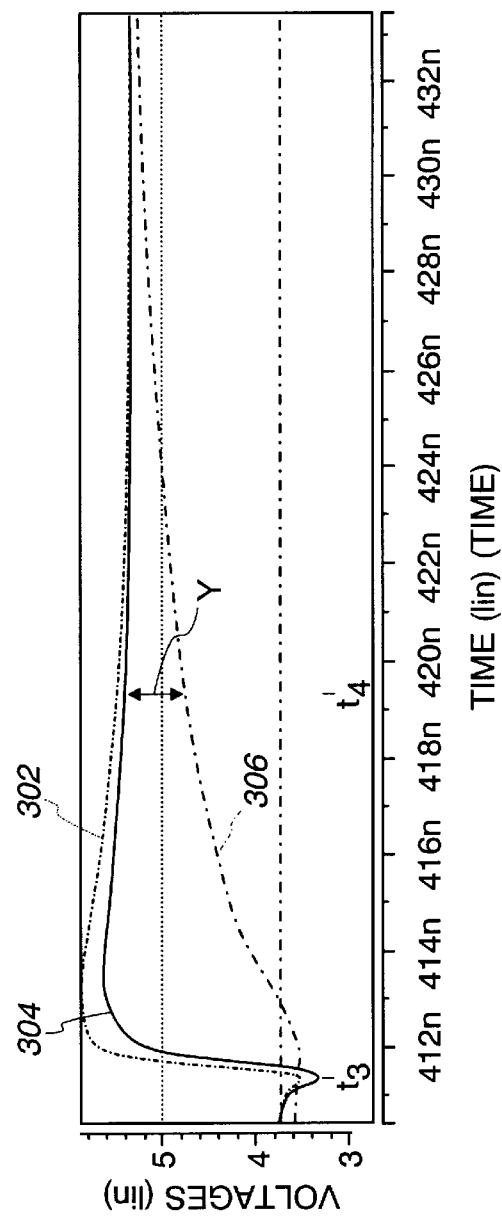

Before describing in detail the tracking structure of the present invention and its operation, it is believed that it would be helpful in understanding the principles of the instant invention and to serve as a background by explaining initially the operation for performing a Read in the EEPROM memory device of FIG. 1 as well as the problem associated therewith in connection with FIGS. 2 and 3.

As will be noted from FIGS. 1 and 2, during a Read mode of operation for the case of a selected "near" sector S23, the boosted voltage VPXG of curve 202 from the boosting circuit 16 will be raised above the input supply potential vCC, beginning at time t1. Since the reference sector 20 is located near the boosting circuit 16, the reference wordline voltage of curve 204 on the reference wordline $WL_R$ will follow and be substantially equal to the boosted voltage VPXG. While the "near" sector S23 is located farther away from the boosting circuit 16 than the reference sector 20, the wordline voltage VPXG1 of curve 206 on the wordline $WL_N$ will still be substantially equal to the boosted voltage VPXG. Further, at the time $t_2$ when the actual reading occurs there is only a small difference X between the reference wordline voltage and the "near" sector wordline voltage VPXG1. This is an acceptable condition and will not cause an error in Reading.

As will be noted from FIGS. 1 and 3, during a Read mode of operation for the case of a selected "far" sector S24, the boosted voltage VPXG of curve 302 from the boosting circuit 16 will again be raised above the supply potential VCC, beginning at time $t_3$. Since the reference sector 20 is located near the boosting circuit 16, the reference wordline voltage of curve 304 on the wordline $WL_R$ will again follow and be substantially equal to the boosted voltage VPXG. However, since the "far" sector is located very far away from the boosting circuit 16, the wordline voltage VPXG2 of curve 306 on the sector core wordline $WL_F$ will not follow the boosted voltage VPXG. This is due to a mismatch in resistance and capacitance in the paths of the sector wordline and the reference wordline to the boosting circuit.

In addition, at the time $t_4$ when the actual Reading occurs, there will be a large difference Y between the reference wordline voltage and the sector wordline voltage VPXG2. As a consequence, this voltage difference will lead to an error in Reading due to the creation of a lower sense margin in the sensing circuitry used during the reading operation.

Thus, the Read operation performed in FIG. 1 will suffer from the disadvantage of creating a Read error since there is no tracking of the reference wordline voltage with the sector wordline voltage.

As used herein, the term "margin" is defined to be the difference in currents existing between the memory core bit lines and the reference bit lines. In other words, a suitable "margin" must be developed between the differential currents before a sense amplifier can reliably amplify the difference. Further, the current in the bit line will be proportional to the difference between the wordline voltage and the threshold voltage of the transistor cell. Thus, if only the wordline voltage applied to the memory core cell in a sector is reduced, the differential current will be very small, thereby causing an error in reading.

In view of this, the inventors of the present invention have developed a wordline tracking structure for matching reference and sector core wordline voltages across the entire chip regardless of sector location. In other words, the voltage difference between the voltage on the reference wordline $WL_R$ associated with the reference sector 420 and the voltage on the sector core wordline $WL_F$ associated with the "far" sector or any sector therebetween will be maintained to be small notwithstanding the location of the selected sector. Therefore, the sense margin will be sufficient when reading any sector in the array, thereby avoiding any errors. This is because the reference wordline voltage tracks the sector core wordline voltage independent of the sector location.

This tracking structure of the present invention is achieved by extending farther the length of the VPXG conductor line in FIG. 1 coming from the boosting circuit 16 and returning it back to a position adjacent to the boosting circuit 16. Next, the conductor line between the output node N1 of the boosting circuit 16 and the input of the reference sector 20 associated with the reference wordline $WL_R$ is severed or disconnected. Thus, the distal end of the extended VPXG conductor line is joined to the input of the reference sector.

Referring now back to FIG. 4, it can be seen that the tracking structure includes an extended or second VPXG conductor line 422 having a first end 424 and a second end 426. The first end 424 of the second conductor line 422 is connected at node N3 to the distal end of the original or first VPXG conductor line 421. It should be noted that the distal end of the original VPXG conductor line 421 is located adjacent to the sector wordline associated with the "far" sector S424. The second end 426 of the conductor line 422 is connected to the reference sector 420 at node N4. Unlike the prior art of FIG. 1, the node N1 at the output of the booster circuit 416 is not connected to the node N4 or the input of the reference sector 420. By this modification, the reference wordline voltage on the reference wordline $WL_R$ at the node N4 will closely track the sector core wordline voltage VPXG2 on the sector wordline $WL_F$ at the node N3 irrespective of where the sector is located.

Figure 5:
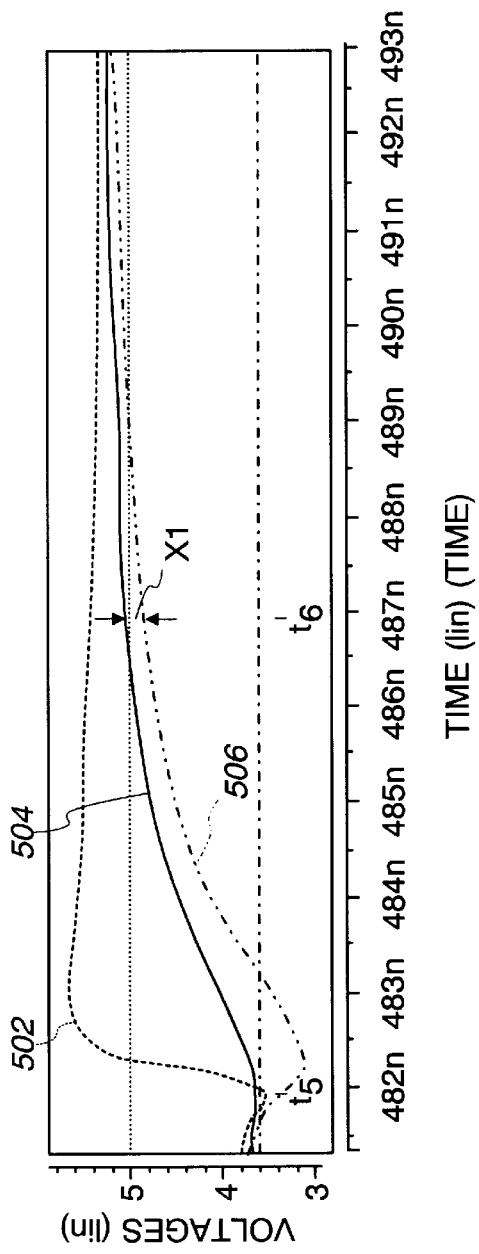
FIG. 5 and 6 show the waveforms of various signals in the respective "near" and "far" sectors in FIG. 4, useful in understanding how the reading problem is solved.

As will be noted from FIGS. 4 and 5, during a Read mode of operation for the case of a selected "near" sector S423, the boosted voltage VPXG of curve 502 from the boosting circuit 416 will again be raised above the power supply potential VCC, beginning at time $t_5$. It will be noted that the reference wordline voltage of curve 504 on the reference wordline $WL_R$ will not follow the boosted voltage VPXG. Due to the severing of the connection between the nodes N1 and N4 and the addition of the second VPXG conductor line 422, the boosted voltage VPXG must travel through both conductors 421 and 422 in order to reach the node N4. As can be seen, the reference wordline voltage of the curve 504 will now follow and be substantially equal to the wordline voltage VPXG1 of curve 506 on the wordline $WL_N$. Further, at the time t6 when the actual Reading occurs, there will be still a small difference X1 between the reference wordline voltage and the "near" sector wordline VPXG1.

Figure 6:
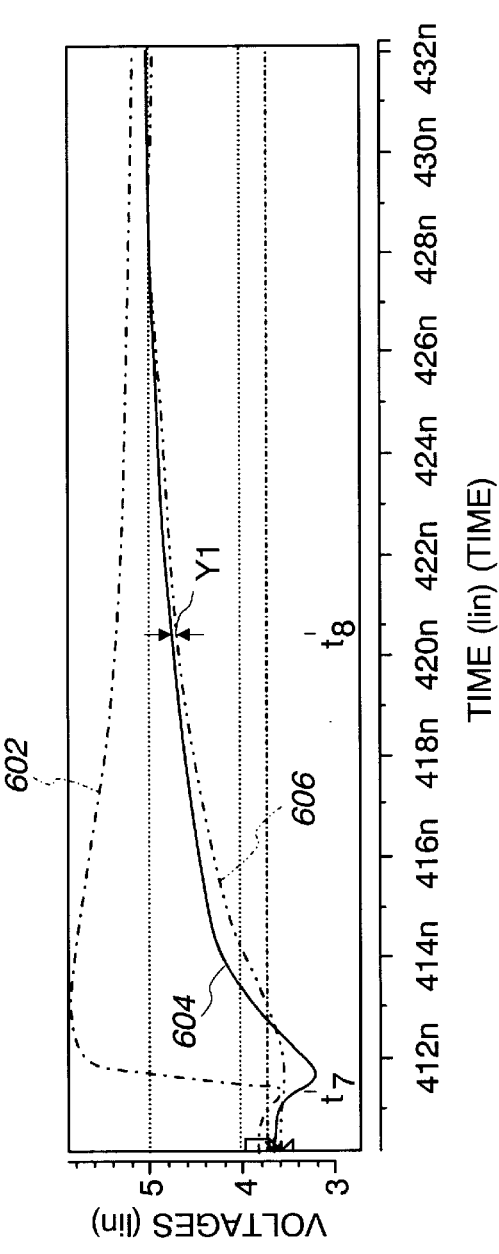

As will be noted from FIGS. 4 and 6, during a Read mode of operation for the case of a selected "far" sector S424, the boosted voltage VPXG of curve 602 from the booster circuit 416 will again be raised above the power supply potential VCC, beginning at time t7. However, this time it will be noted that the reference wordline voltage of curve 604 will follow and be substantially equal to the sector wordline voltage VPXG2 of curve 606. At the time t8 when the actual Reading occurs, there is shown this time a small difference Y1 between the reference wordline voltage and the "far" sector wordline voltage. As a result, there has been eliminated the possibility of an error occurring during the reading mode of operation.

In the present invention, the voltage on the reference wordline $WL_R$ will follow the voltage on the sector core wordline $WL_F$ due to the fact that the capacitive loading from the capacitor $C_S$ associated with the selected sector S424 is significantly larger than the capacitive loading from the capacitor $C_R$ associated with the reference sector 420 (the equivalent capacitance of the reference mini-array). Therefore, the delay of a signal traveling along the extended VPXG conductor line 422 is considerably less that the delay encountered along the first VPXG conductor line 421. Consequently, the delay through the lumped resistive load R1 associated with the conductor 421 is dominated by the time constant $R1C_S$.

It should be clearly understood by those skilled in the art that if the capacitor $C_S$ is connected part way along the conductor 421 (e.g., the sector S420 being selected) then the length of the resistance from the node N2 to the sector S420 can be considered as a value of R1a with a consequential delay dominated by the time constant $R1aC_S$. In this case, the actual value of the lumped resistive load R2 would be the sum of the resistances due to R2 and a portion of R1 extending beyond the point of the selected sector S420.

However, for most values of R1a as defined above, the delay is dominated by the time constant $R1aC_S$ and the voltage at the node N4 will closely follow the selected sector wordline voltage due to the relatively shorter time constant $R2C_R$. As a result, for any position of the capacitor $C_S$ along the conductor 421, the voltage at the node N4 will substantially follow the selected sector wordline voltage since the time constant $R1aC_S$ will be dominating.

Figure 7:
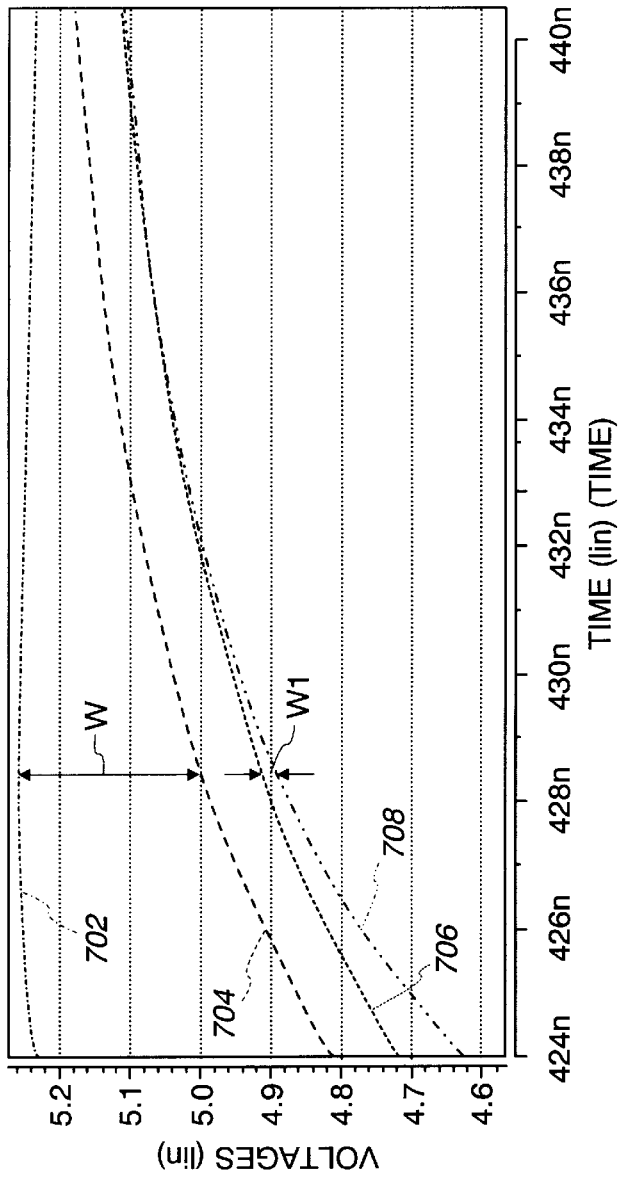
FIG. 7 shows waveforms of the reference cell wordline voltage and the sector core wordline voltage for the "far" sector in FIGS. 1 and 4, respectively.

In FIG. 7, there are depicted waveforms of the reference wordline voltage and the sector core wordline voltage during a Read mode for the "far" sector of FIGS. 1 and 4, respectively. The curve 702 represents the reference wordline voltage and the curve 704 represents the sector core wordline voltage during the Read for the "far" sector in the prior art of FIG. 1. By comparing the curves 702 and 704, it can be seen that the difference W between them illustrates the large voltage difference existing between the reference wordline voltage and the sector core wordline voltage. On the other hand, the curve 706 represents the reference wordline voltage and the curve 708 represents the sector core wordline voltage during the Read for the "far" sector in the present invention of FIG. 4. By comparing the curves 706 and 708, it can be seen that the difference W1 between them illustrates a very small voltage difference existing between the reference wordline voltage and the sector core wordline voltage.

Figure 8:
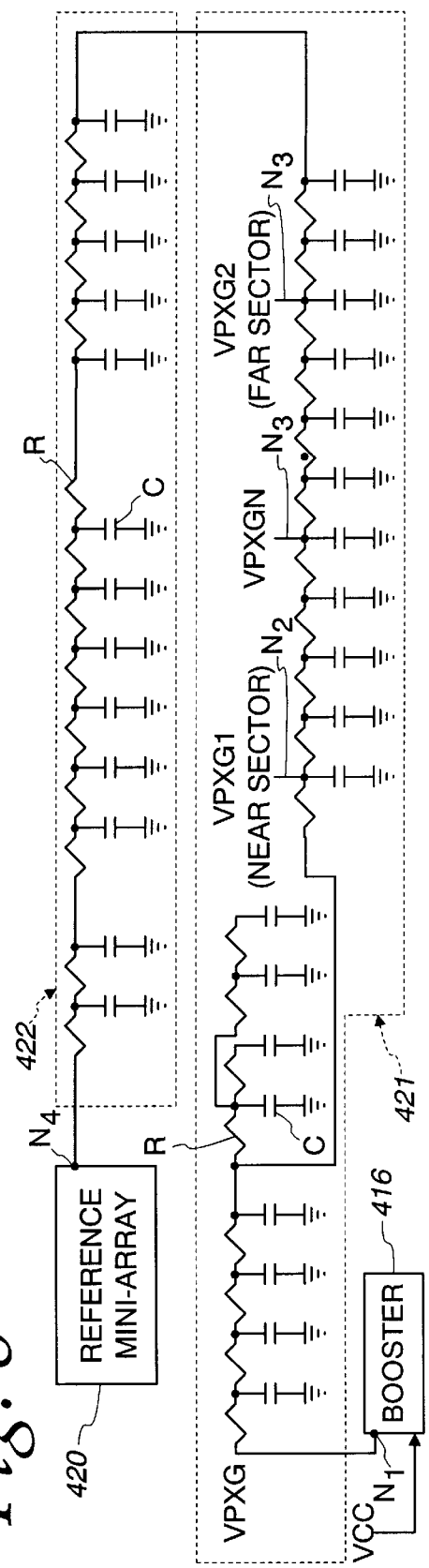
FIG. 8 is a schematic circuit diagram of the resistance and parasitic capacitance associated with the first and second VPXG conductor lines of FIG. 4.

In FIG. 8, there is shown a schematic circuit diagram illustrating the resistance and parasitic capacitance existing in the original or first VPXG conductor line 421 of FIG. 4 between the boosting circuit 416 and the sector wordline $WL_F$ associated with the "far" sector and, the resistance and parasitic capacitance in the extended VPXG conductor line 422 between the sector wordline $WL_F$ associated with the "far" sector and the reference wordline $WL_R$ associated with the reference sector 420. By the addition of the extended VPXG conductor line 422 of the present invention, the delay characteristic or time constant in the path between the nodes N3 and N4 is made to be smaller than in the original VPXG conductor line 421 between the nodes N1 and N3.

From the foregoing detailed description, it can thus be seen that the present invention provides a wordline tracking structure for use in Flash EEPROM memory cells divided into a plurality of sectors so as to match reference and sector core wordline voltages across the entire chip regardless of sector location. The wordline tracking structure of the present invention includes a second VPXG conductor line operatively connected between sector wordlines of a "far" sector and a reference cell mini-array. The second VPXG conductor line has a substantially smaller time constant than in a first VPXG conductor line operatively connected between an output of a booster circuit and the sector wordlines of the "far" sector.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a semiconductor memory device including an array of Flash EEPROM memory cells, the improvement comprising a wordline tracking structure for matching reference and sector core wordline voltages across the entire chip regardless of sector location:

a memory array having a plurality of memory core cells divided into a plurality of sectors, each sector having the memory core cells therein arranged in rows of wordlines and columns of bit lines intersecting the rows of wordlines, said sector being located individually across the entire area of the chip;

reference cell mini-array having a plurality of reference core cells arranged in rows of reference core wordlines and in columns of reference bit lines;

a row decoder for selecting certain sector wordlines in one of said plurality of sectors;

a booster circuit for generating a wordline supply voltage boosted to be higher than a power supply potential for driving the selected wordlines via said row decoder during a Read mode of operation and for driving said reference core wordline;

said booster circuit and said reference cell mini-array being physically located close to each other on a portion of said chip;

one of said plurality of sectors being located physically near to said booster circuit defining a "near" sector;

another one of said plurality of sectors being located physically far from said booster circuit defining a "far" sector;

a first VPXG conductor line having a first end operatively connected to an output of said booster circuit adjacent said "near" sector and having a second end operatively connected to sector wordlines of said "far" sector;

a second VPXG conductor line having a first end operatively connected to the second end of said first VPXG conductor line at the sector wordlines of said "far" sector and having a second end operatively connected to said reference cell mini-array;

said second VPXG conductor line having a substantially smaller delay characteristic than in said first VPXG conductor line so that the reference wordline voltage associated with the reference mini-array will track closely the sector wordline voltage during the Read operation regardless of the location of the selected sector and said booster circuit driving the sector wordlines via said first VPXG conductor line and driving the reference mini-array via said first VPXG conductor line and said second VPXG conductor line.

2. In a semiconductor memory device as claimed in claim 1, wherein said second VPXG conductor line has a delay characteristic defined by a time constant $R2C_R$, where R2 is its resistive loading and $C_R$ is the capacitive loading of the reference cell mini-array.

3. In a semiconductor memory device as claimed in claim 2, wherein said first VPXG conductor line has a delay characteristic defined by a time constant $R1C_S$, where R1 is its resistive loading and $C_S$ is the capacitive loading of the selected sector.

4. In a semiconductor memory device as claimed in claim 3, wherein the capacitive loading $C_R$ is substantially less than the capacitive loading $C_S$ for any selected sector.

* * * * *

UNITED STATES PATENT AND TRADEMARK OFFICE
CERTIFICATE OF CORRECTION

PATENT NO : 6,163,481
DATED     : December 19, 2000
INVENTOR(S): Shigekasu Yamada et al.

It is certified that error appears in the above-identified patent and that said Letters Patent is hereby corrected as shown below:

Column 4, line 5, change "S40", to -- S400 --.

Signed and Sealed this

Twenty-ninth Day of May, 2001

Attest:

NICHOLAS P. GODICI

Attesting Officer

Acting Director of the United States Patent and Trademark Office